(12) United States Patent
Liau et al.

(10) Patent No.: US 7,889,504 B2
(45) Date of Patent: Feb. 15, 2011

(54) PORTABLE ELECTRONIC DEVICE

(75) Inventors: Wen-Jen Liau, Nantou Hsien (TW);
Jin-Ching Guo, Tainan Hsien (TW);
Ching-Sheng Chang, Taichung Hsien
(TW); Hsin-Shun Chen, Changhua
Hsien (TW)

(73) Assignee: **Universal Scientific Industrial Co.,
Ltd.**, Nan-Tou Hsien (TW)

( * ) Notice: Subject to any disclaimer, the term of this patent is extended or adjusted under 35 U.S.C. 154(b) by 518 days.

(21) Appl. No.: 11/961,490

(22) Filed: Dec. 20, 2007

(65) Prior Publication Data

US 2009/0116206 A1    May 7, 2009

(51) Int. Cl.
*H05K 7/20* (2006.01)
(52) U.S. Cl. .................. 361/719; 361/760; 361/748
(58) Field of Classification Search ............... 361/752, 361/730, 790, 735, 797, 800, 805, 679.01, 361/719, 688, 748, 760, 772, 774, 704; 439/55, 439/65, 67, 73.1, 78, 736, 874; 174/50, 520, 174/559
See application file for complete search history.

(56) References Cited

U.S. PATENT DOCUMENTS

| | | | | |
|---|---|---|---|---|
| 5,592,199 A | * | 1/1997 | Kawaguchi et al. | 345/206 |
| 6,365,848 B1 | * | 4/2002 | Maple | 200/5 A |
| 6,897,912 B2 | * | 5/2005 | Kawakami et al. | 349/61 |
| 7,492,433 B2 | * | 2/2009 | Imajo et al. | 349/149 |
| 2002/0012096 A1 | * | 1/2002 | Uchiyama | 349/187 |
| 2003/0117543 A1 | * | 6/2003 | Chang | 349/58 |

* cited by examiner

*Primary Examiner*—Hung S Bui
(74) *Attorney, Agent, or Firm*—McNees Wallace & Nurick LLC

(57) ABSTRACT

A portable electronic device includes: a printed circuit board having opposite first and second surfaces and provided with at least one electronic component, the first surface being provided with at least one conductive pad that is electrically coupled to the electronic component; and a flexible circuit board having a main part stacked on the second surface of the printed circuit board, and an extension part extending and folded from the main part and stacked on the first surface of the printed circuit board. The extension part is provided with at least one conductive bump thereon. An outer surface of the main part is provided with at least one input key that is electrically coupled to the conductive bump. The conductive pad is bonded to the conductive bump.

5 Claims, 7 Drawing Sheets

PORTABLE ELECTRONIC DEVICE

BACKGROUND OF THE INVENTION

1. Field of the Invention

The invention relates to a portable electronic device, more particularly to a portable electronic device including a printed circuit board and a flexible circuit board having main and extension parts disposed respectively on opposite sides of the printed circuit board.

2. Description of the Related Art

Referring to FIG. 1, a conventional portable electronic device is shown to have a printed circuit board 1 that includes a plurality of electronic components 12 and a plurality of input keys 11 coupled electrically to the electronic components 12. The printed circuit board 1 further includes a plurality of buttons (not shown) connected respectively to the input keys 11 for the user to actuate the input keys 11.

However, a relatively large space is required to install the input keys 11 and the electronic components 12, which hinders miniaturization of the portable electronic device.

SUMMARY OF THE INVENTION

Therefore, the object of the present invention is to provide a portable electronic device that can overcome the aforesaid drawback associated with the prior art.

Accordingly, a portable electronic device of this invention comprises: a printed circuit board having opposite first and second surfaces, the first surface being provided with at least one conductive pad; a flexible circuit board having inner and outer surfaces, a main part stacked on the second surface of the printed circuit board, and an extension part extending and folded from the main part and stacked on the first surface of the printed circuit board. The inner surface of the extension part faces the first surface of the printed circuit board and is provided with at least one conductive bump thereon. The outer surface of the main part is provided with at least one input key that is electrically coupled to the conductive bump. The conductive pad is bonded to the conductive bump. An anisotropic conductive material bonded to the conductive pad and the conductive bump.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
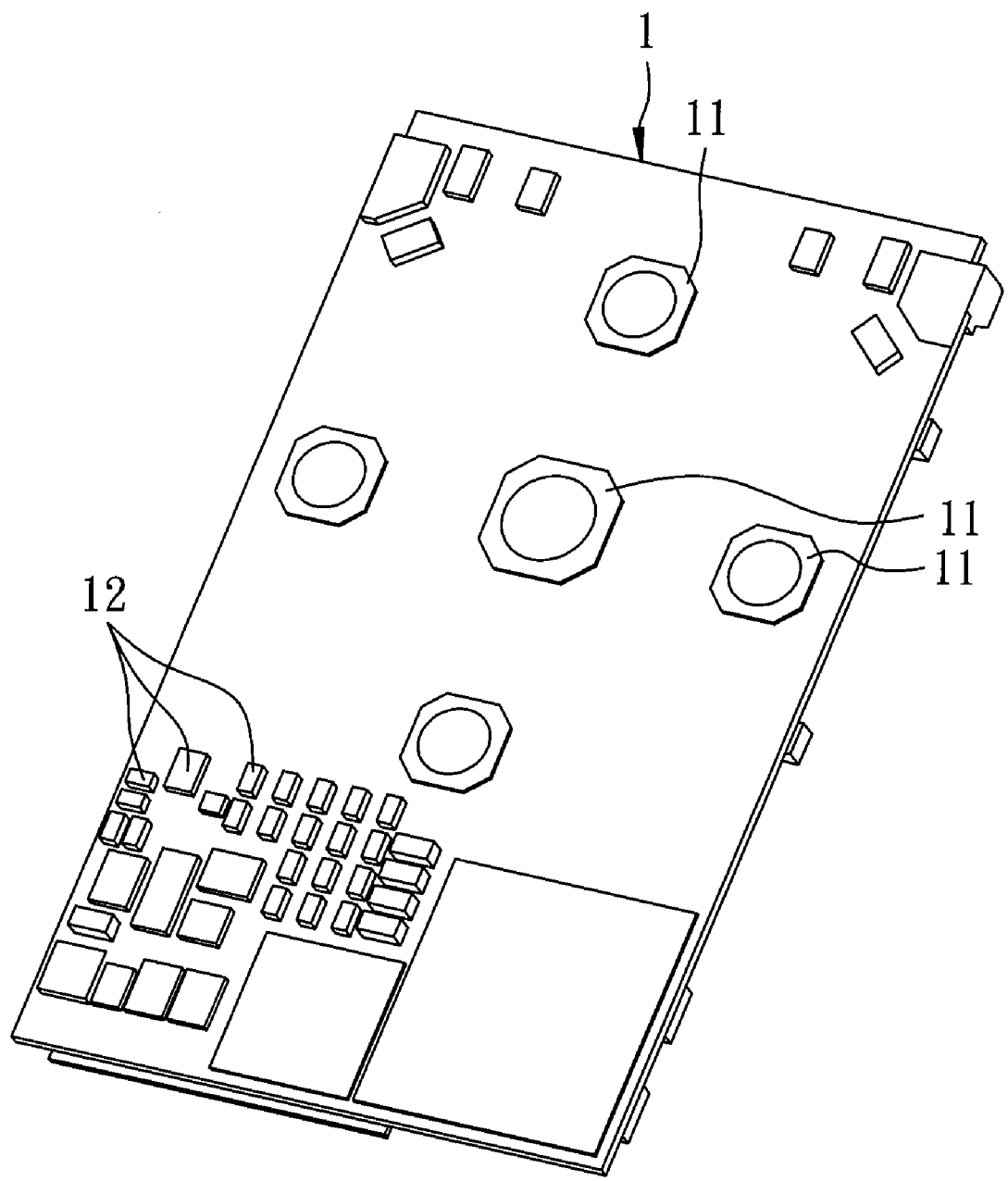
FIG. 1 is a perspective view of a conventional portable electronic device.
Figure 2:
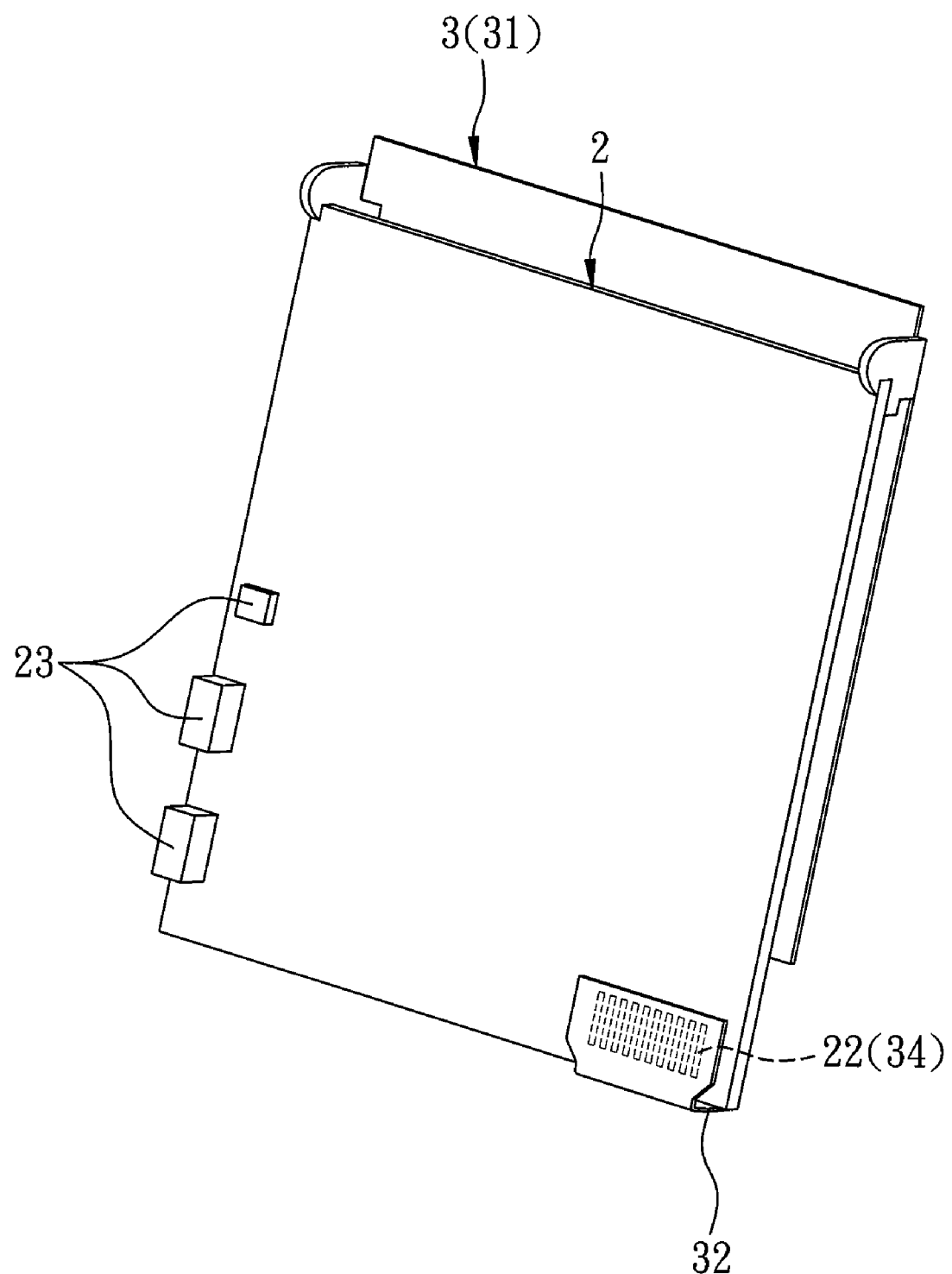
FIG. 2 is an assembled perspective view of the first preferred embodiment of a portable electronic device according to the present invention.
Figure 3:
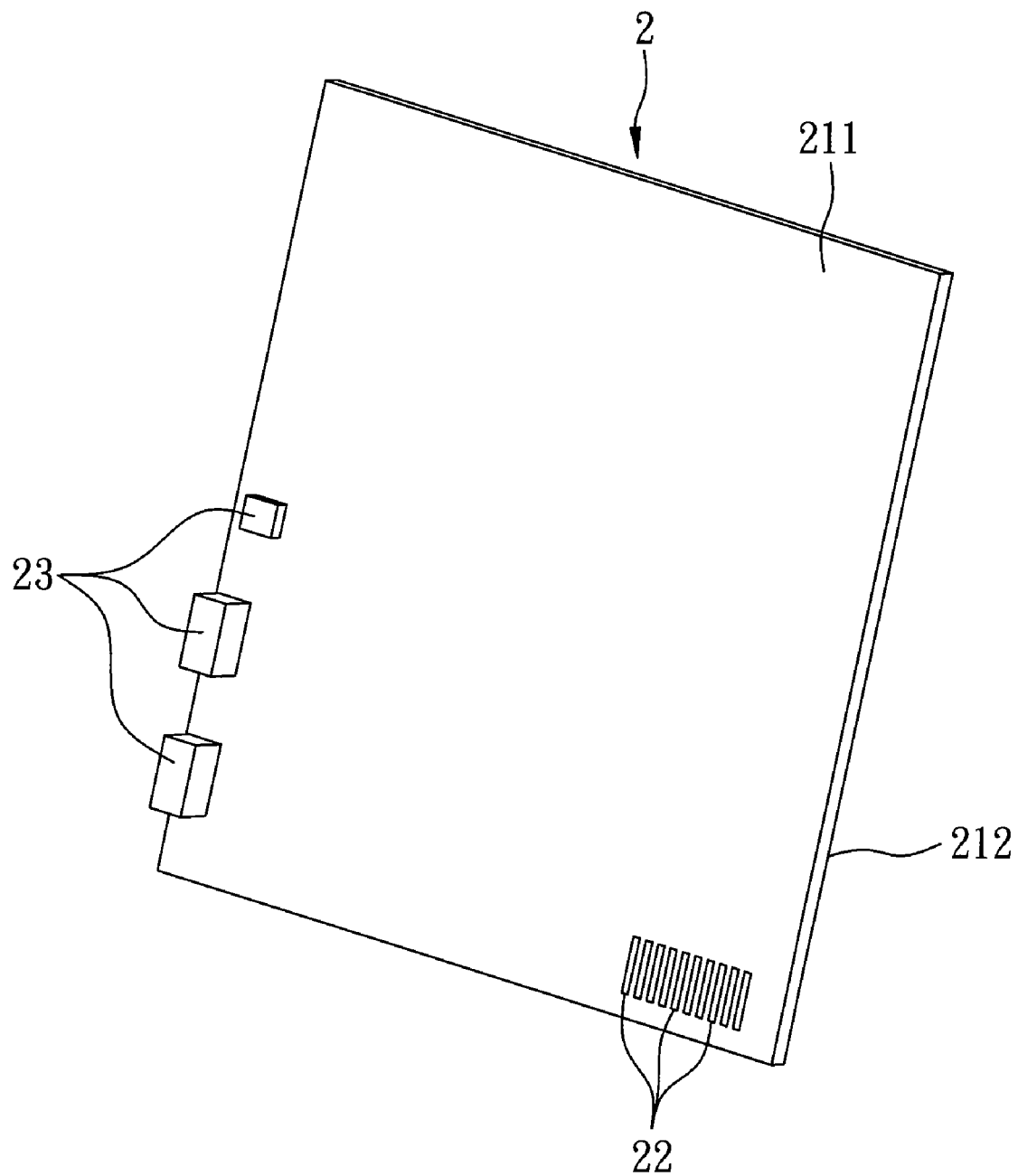
FIG. 3 is a perspective view of a printed circuit board of the first preferred embodiment.
Figure 4:
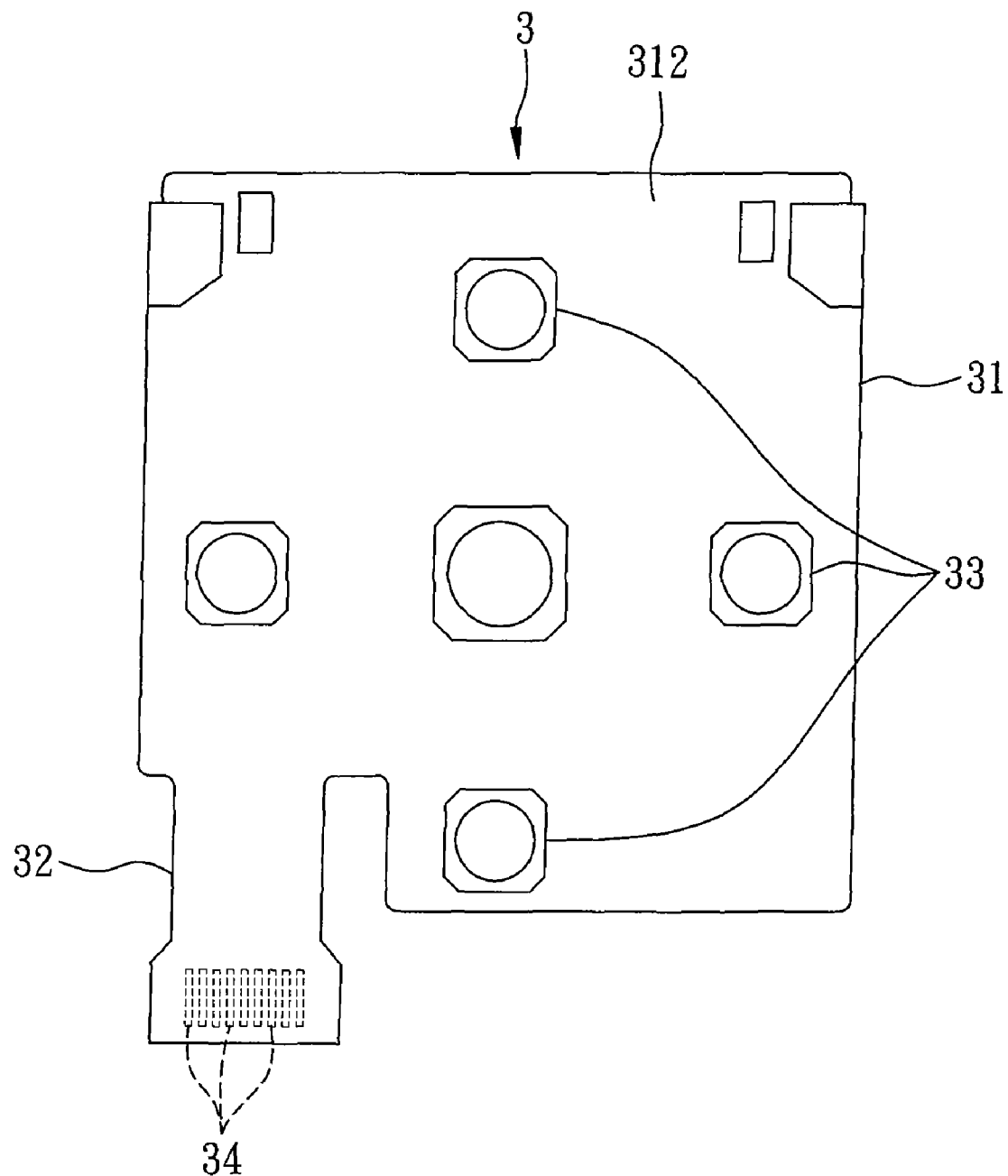
FIG. 4 is a schematic top view of a flexible circuit board of the first preferred embodiment.

Before the present invention is described in greater detail with reference to the accompanying preferred embodiments, it should be noted herein that like elements are denoted by the same reference numerals throughout the disclosure.

Referring to FIGS. 2 to 7, the first preferred embodiment of a portable electronic device according to the present invention is shown to include: a printed circuit board 2 having opposite first and second surfaces 211, 212, the first surface 211 being provided with conductive pads 22; a flexible circuit board 3 having inner and outer surfaces 311, 312, a main part 31 stacked on the second surface 212 of the printed circuit board 2, and an extension part 32 extending and folded from the main part 31 and stacked on the first surface 211 of the printed circuit board 2. The inner surface 311 of the extension part 32 faces the first surface 211 of the printed circuit board 2 and is provided with conductive bumps 34 thereon. The outer surface 312 of the main part 31 is provided with input keys 33 that are electrically coupled to the conductive bumps 34. The conductive pads 22 are bonded to the conductive bumps 34 through an anisotropic conductive material 4, respectively.

In this embodiment, the flexible circuit board 3 is a flexible printed circuit board (FPCB). The printed circuit board is provided with electronic components 23 that are coupled electrically to the conductive pads 22 through a plurality of conductive traces (not shown) printed on the printed circuit board 2.

In this embodiment, the anisotropic conductive material 4 is in the form of an anisotropic conductive paste (ACP) bonded to the conductive pads 22 and the conductive bumps 34. The anisotropic conductive material 4 is made from a mixture of an epoxy resin material 41 and conductive particles 42 dispersed in the epoxy resin material 41. The conductive particles 42 are preferably made from one of nickel and nickel alloy, and have an average particle diameter ranging from 2 to 3.5 microns.

The printed circuit board 2 is provided with a spacer 24 spaced apart from and confronting the second surface 212 of the printed circuit board 2. The main part 31 of the flexible circuit board 3 is stacked on the spacer 24 so as to be spaced apart from the printed circuit board 2. In this embodiment, the spacer 24 is in the form of a frame.

Figure 5:
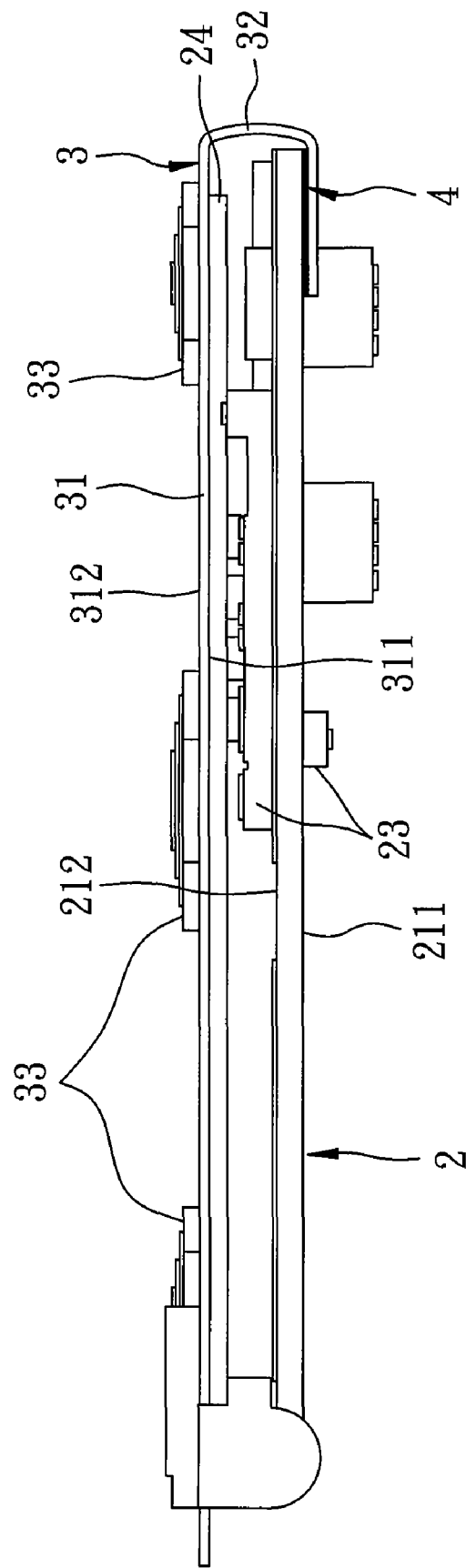
FIG. 5 is an assembled side view of the first preferred embodiment.
Figure 6:
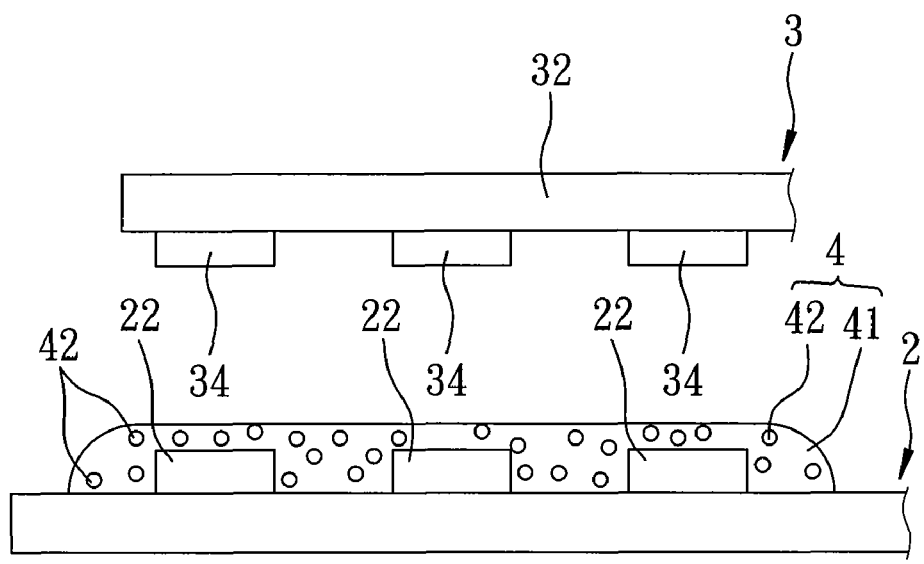
FIGS. 6 and 7 are fragmentary schematic views to illustrate how conductive pads on the printed circuit board are bonded to conductive bumps on the flexible circuit board of the first preferred embodiment.
Figure 7:
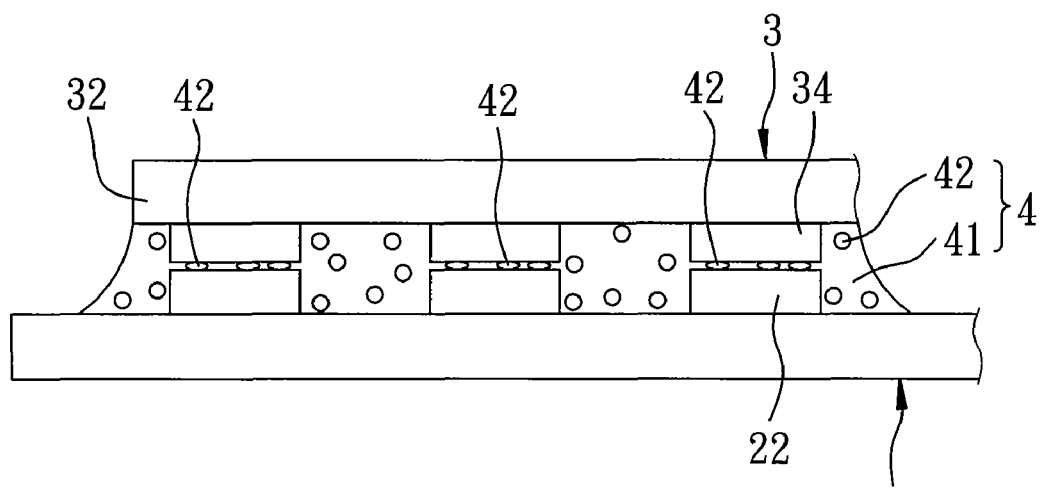

During assembly of the printed circuit board 2 and the flexible circuit board 3, the anisotropic conductive material 4 is applied to the conductive pads 22 of the printed circuit board 2 (see FIG. 6) by printing or syringe dispensing techniques, the conductive bumps 34 on the extension part 32 of the flexible circuit board 3 are then respectively aligned with and bonded to the conductive pads 22 of the printed circuit board 2 (see FIG. 7) using a thermal press bonding machine (not shown), and the main part 31 of the flexible circuit board 3 is subsequently folded from the extension part 32 until the main part 32 abuts against the spacer 24 (see FIG. 5).

Figure 8:
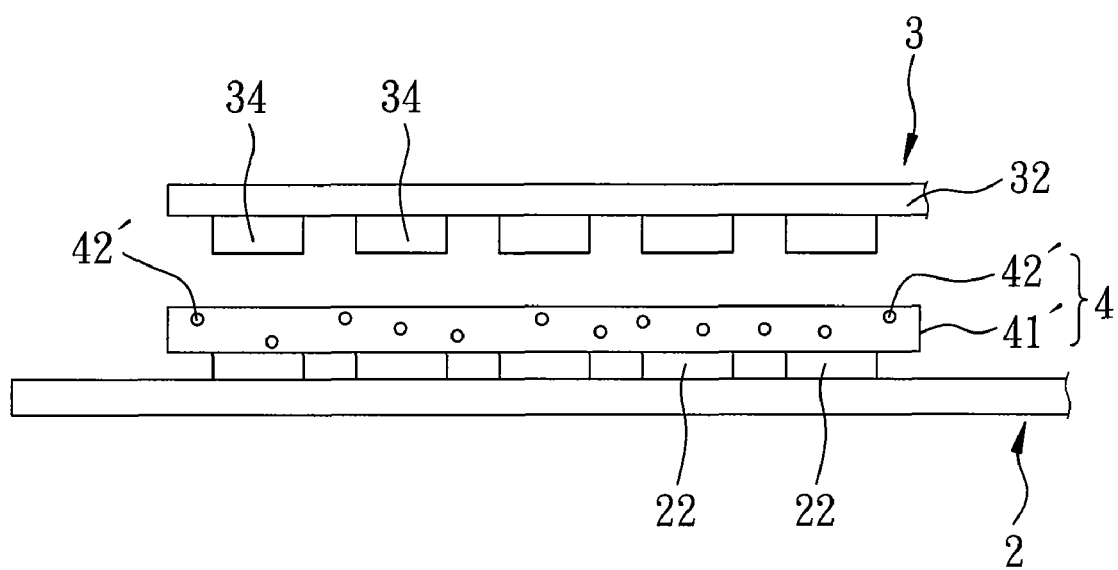
FIG. 8 is a fragmentary schematic view of the second preferred embodiment of the portable electronic device according to this invention.

FIG. 8 illustrates the second preferred embodiment of the portable electronic device according to this invention. The second preferred embodiment differs from the previous embodiment in that the anisotropic conductive material 4 is in the form of an anisotropic conductive film (ACF) that includes an adhesive film 41' and conductive particles 42' dispersed in the adhesive film 41'.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A portable electronic device comprising:
a printed circuit board having opposite first and second surfaces, said first surface being provided with at least one conductive pad;
a flexible circuit board having inner and outer surfaces, a main part stacked on said second surface of said printed circuit board, and an extension part extending and folded from said main part and stacked on said first surface of said printed circuit board, said inner surface of said extension part facing said first surface of said printed circuit board and being provided with at least one conductive bump thereon, said outer surface of said main part being provided with at least one input key that is electrically coupled to said conductive bump, said conductive pad being bonded to said conductive bump; and
an anisotropic conductive material bonded to said conductive pad and said conductive bump.

2. The portable electronic device as claimed in claim 1, wherein said anisotropic conductive material is made from a mixture of an epoxy resin material and conductive particles dispersed in said epoxy resin material.

3. The portable electronic device as claimed in claim 2, wherein said conductive particles have an average particle diameter ranging from 2 to 3.5 microns.

4. The portable electronic device as claimed in claim 1, wherein said printed circuit board is provided with a spacer spaced apart from and confronting said second surface of said printed circuit board, said main part of said flexible circuit board being stacked on said spacer.

5. The portable electronic device as claimed in claim 1, wherein an area of said main part of said flexible circuit board is greater than an area of said extension part thereof.

* * * * *